(12) United States Patent
Liu et al.

(10) Patent No.: US 6,613,632 B2
(45) Date of Patent: Sep. 2, 2003

(54) FABRICATION METHOD FOR A SILICON NITRIDE READ-ONLY MEMORY

(75) Inventors: Chien-Hung Liu, Taipei (TW); Shyi-Shuh Pan, Kaohsiung (TW); Shou-Wei Huang, Chilung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/158,260

(22) Filed: May 28, 2002

(65) Prior Publication Data

US 2002/0177275 A1 Nov. 28, 2002

(30) Foreign Application Priority Data

May 28, 2001 (TW) ........................................ 90112761 A

(51) Int. Cl.$^7$ ........................................... H01L 21/8247
(52) U.S. Cl. ...................... 438/261; 438/287; 438/297; 438/445
(58) Field of Search .................. 438/216, 261, 438/287, 288, 297, 439, 444, 445, 954, 981

(56) References Cited

U.S. PATENT DOCUMENTS

| | | | |
|---|---|---|---|
| 5,756,390 A | * | 5/1998 | Juengling et al. ........... 438/439 |
| 6,187,640 B1 | * | 2/2001 | Shimada et al. ............ 438/439 |

* cited by examiner

*Primary Examiner*—Chandra Chaudhari
(74) *Attorney, Agent, or Firm*—J. C. Patents

(57) ABSTRACT

A fabrication method for a read-only memory with a silicon nitride floating gate is provided. A first oxide layer and a silicon nitride layer are sequentially formed on a substrate. The silicon nitride layer and the first oxide layer are then patterned to form an opening, exposing a portion of the substrate. An oxidation process is then conducted to form a second oxide layer on the silicon nitride layer and concurrently to form a field oxide layer on the exposed substrate. The second oxide layer, the silicon nitride layer and the first oxide layer are then patterned to form an oxide dielectric layer, a silicon nitride floating gate layer and a tunnel oxide layer.

21 Claims, 3 Drawing Sheets

FABRICATION METHOD FOR A SILICON NITRIDE READ-ONLY MEMORY

CROSS-REFERENCE TO RELATED APPLICATION

This application claims the priority benefit of Taiwan application serial no. 90112761, filed May 28, 2001.

BACKGROUND OF THE INVENTION

1. Field of Invention

This invention relates to a fabrication method for a read-only memory device. More particularly, the present invention relates to a fabrication method for an oxide layer-nitride layer-oxide layer (ONO) structure and a field oxide layer of a flash memory device.

2. Description of Related Art

Flash memory device is an electrically-erasable-programmable-read-only memory device, which has the advantages of being programmable, erasable and the ability of retaining data when the power is interrupted. A flash memory device is thus commonly used in personal computer and electronic devices. A flash memory device is also a non-volatile type of memory (NVM), which has the advantages of being small in dimension, speedy in in data retrieval and storage, and low power consumption. Furthermore, the erasure of data in a flash memory device uses the "block-by-block" method; therefore, it also has the advantage of having a faster operational speed.

For a typical flash memory device, the floating gate and the control gate are formed with doped polysilicon. Electrons are injected into the floating gate and evenly distributed in the polysilicon layer of the floating gate during programming. However, if defects are present in the tunnel oxide layer underneath the polysilicon floating gate layer, current leakage is easily resulted to adversely affect the reliability of the device.

The current technical development on flash memory devices includes forming the floating gate with silicon nitride. The control gate, however, is still formed with polysilicon. When a voltage is applied to the control gate and the source region of this type of device to perform the programming function, electrons in the channel region near the vicinity of the drain region are injected into the silicon nitride floating gate. Since silicon nitride has the characteristic of being able to capture electrons, the electrons injected into the silicon nitride floating gate are not evenly distributed in the entire floating gate. Instead, the electrons are Gaussian distributed and concentrated locally in the floating gate. Because the electrons are concentrated locally in the floating gate, the sensitivity to any defect in the tunnel oxide layer is minimized. As a result, the occurrence of a current leakage is mitigated.

FIGS. 1A through 1D are schematic, cross-sectional views, illustrating successive steps of fabricating a silicon nitride floating gate for a read-only memory according to the prior art.

Referring to FIGS. 1A & 1B, a pad oxide layer 102 and a silicon nitride layer 104 are sequentially formed on a provided substrate 100. The silicon nitride layer 104 and the pad oxide layer 102 are then patterned to expose a portion of the substrate 100. Thereafter, thermal oxidation is conducted to form a field oxide layer 106 on the exposed substrate 100. The silicon nitride layer 104 and the pad oxide layer 102 are further removed, leaving the field oxide layer 106 on the substrate 100.

Referring to FIGS. 1C & 1D, an oxide layer 108 and a silicon nitride layer 110 are sequentially formed on the substrate 100. A wet oxidation process is then conducted to form an oxide layer 112. The oxide layer 112, the silicon nitride layer 110 and the oxide layer 108 are further patterned to form an oxide layer-nitride layer-oxide layer (ONO) structure of a tunnel oxide layer 108a, a silicon nitride floating gate layer 110a and an oxide dielectric layer 112a. Thereafter, ions are implanted between the ONO structures to form the buried bit line in the substrate 100. A polysilicon control gate structure layer is also formed on the silicon oxide dielectric layer 112a. According to the conventional approach in fabricating a silicon nitride read-only memory, the silicon oxide dielectric layer 112a is formed subsequent to the formation of the field oxide layer 106. The manufacturing process is thus more time consuming, complicated and costly.

SUMMARY OF THE INVENTION

The invention provides a fabrication method for a silicon oxide layer-silicon nitride layer-silicon oxide layer structure and a field oxide layer of a flash memory device, to simply the overall manufacturing process.

The present invention provides a combined fabrication of a silicon oxide layer-silicon nitride layer-silicon oxide layer structure and a field oxide layer, to greatly reduce the processing steps and cost The invention provides a fabrication method for a silicon nitride read-only memory, wherein a first oxide layer and a silicon nitride layer are sequentially formed on a provided substrate. The first oxide layer and the silicon nitride layer are then patterned to form an opening, exposing a part of the substrate. Thereafter, an oxidation process is conducted to form a second oxide layer on the silicon nitride layer, wherein concurrently, a field oxide layer is formed on the exposed part of the substrate. The second oxide layer, the silicon nitride layer and the first oxide layer are then patterned to form an oxide dielectric layer, a silicon nitride floating gate layer and an oxide tunnel layer.

According to the present invention, a combined manufacturing of the oxide dielectric layer and the field oxide layer is provided to greatly reduce the number of manufacturing steps and simply the manufacturing process.

According to the present invention, a combined manufacturing of the oxide dielectric layer and the field oxide layer is provided to greatly reduce the manufacturing cost.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
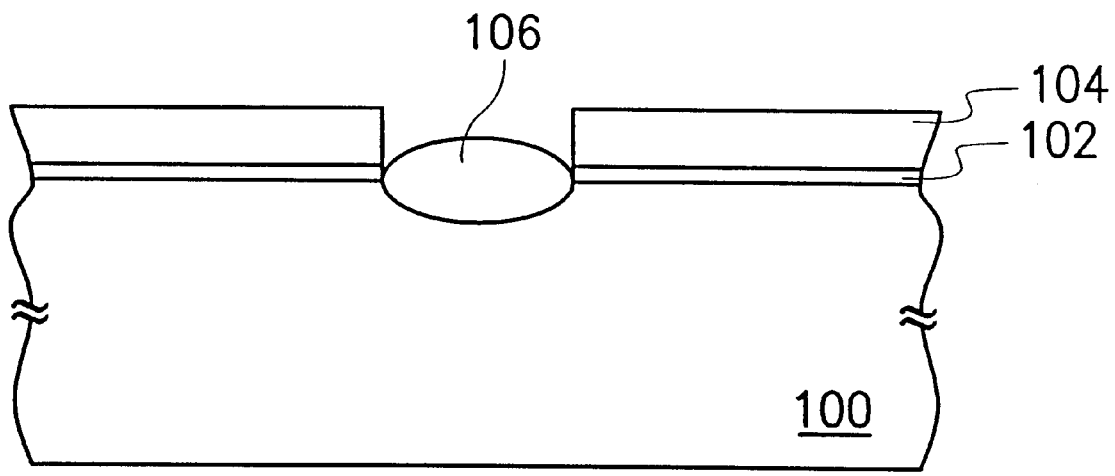
FIGS. 1A through 1D are schematic, cross-sectional views, illustrating successive steps of fabricating a silicon nitride floating gate for a read-only memory according to the prior art.
Figure 1B:
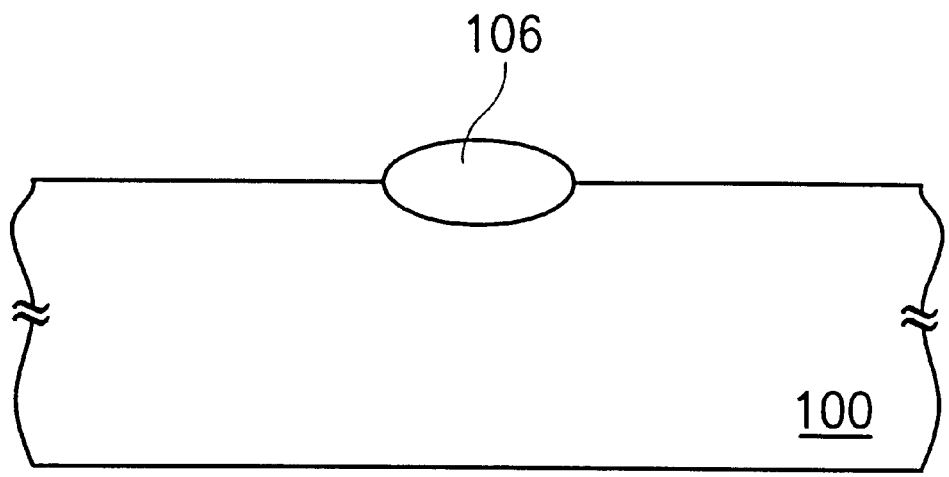
Figure 1C:
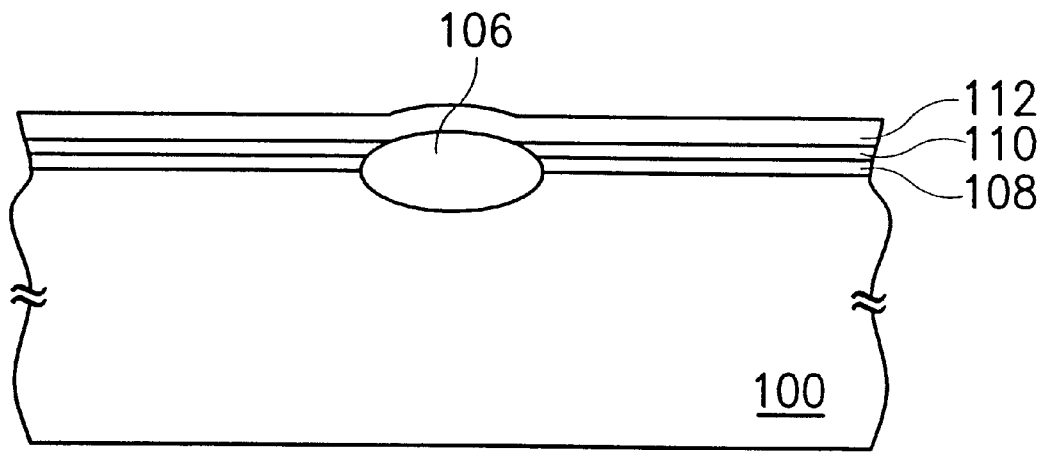
Figure 1D:
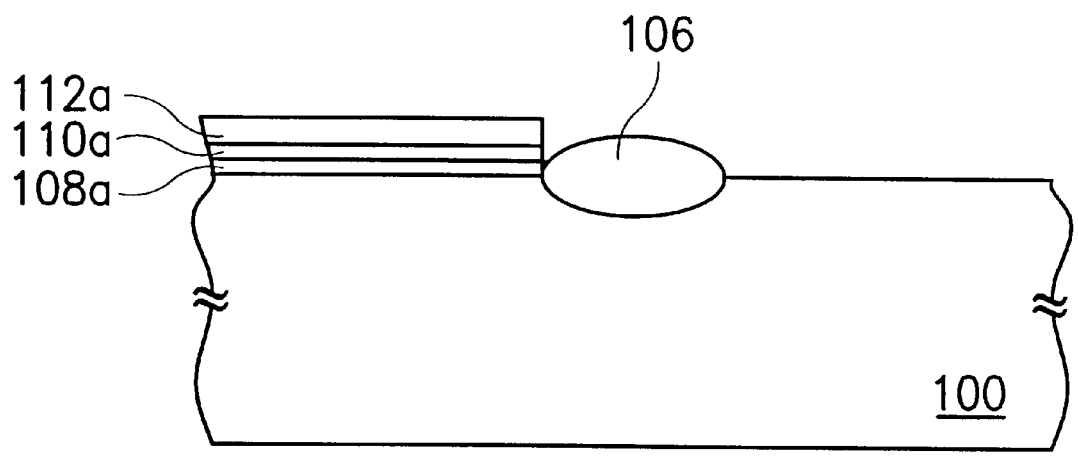
Figure 2A:
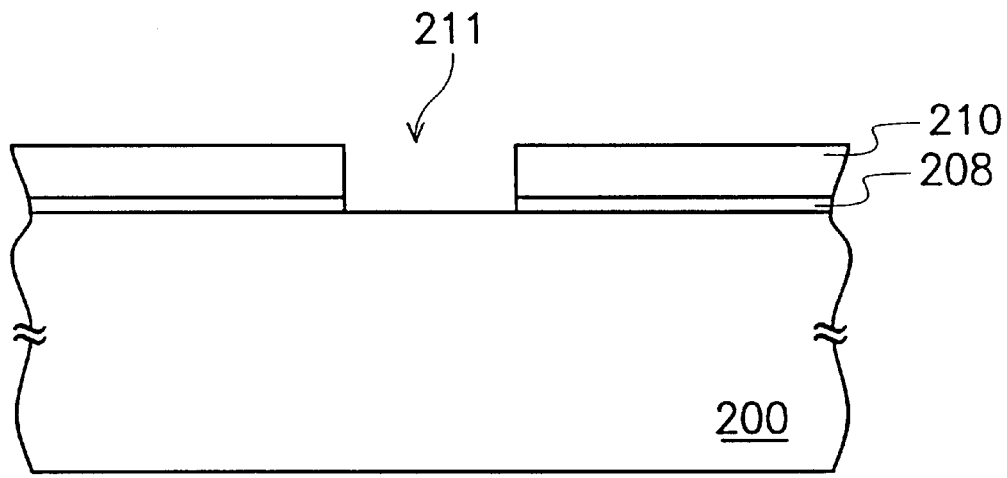
FIGS. 2A through 2C are schematic, cross-sectional views, illustrating successive steps of fabricating a silicon nitride floating gate for a read-only memory according to a preferred embodiment of the present invention.
Figure 2B:
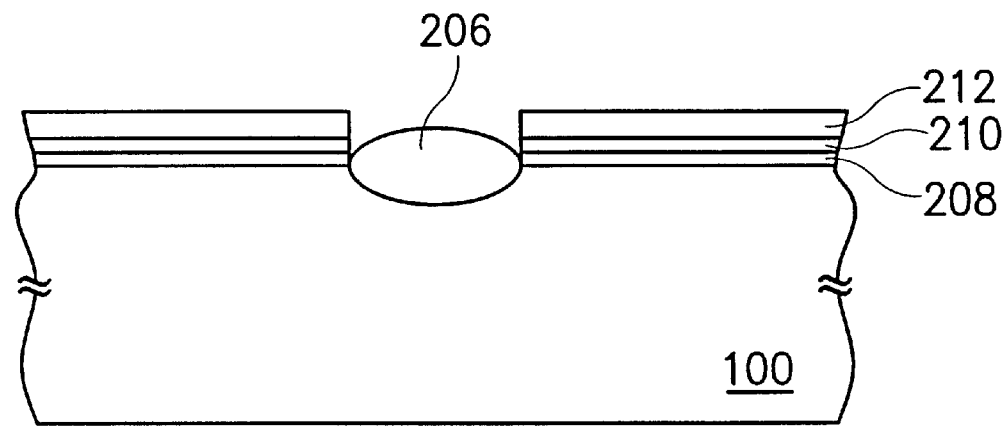
Figure 2C:
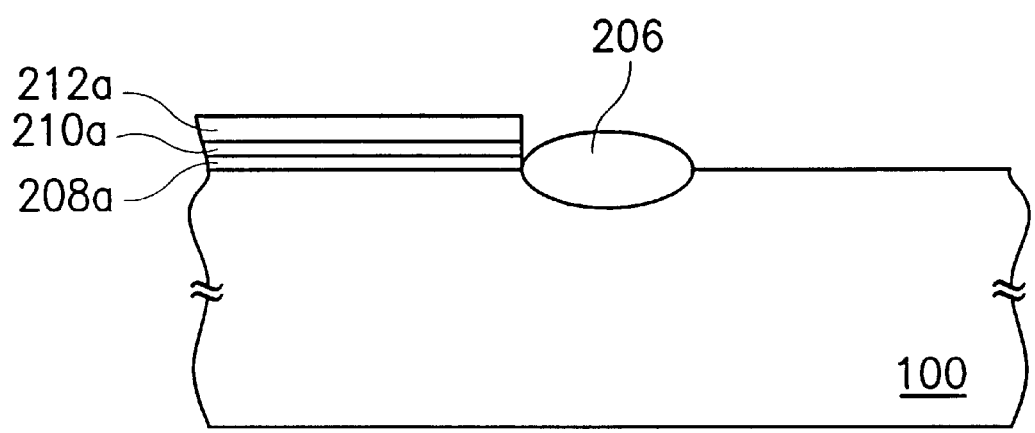

FIGS. 2A through 2C are schematic, cross-sectional views, illustrating successive steps of fabricating a silicon nitride floating gate for a read-only memory according a preferred embodiment of the present invention.

As shown in FIG. 2A, a substrate 200 is provided. An oxide layer 208 is formed on the substrate 200, wherein the oxide layer 208, about 50 angstroms to about 100 angstroms thick, is formed by, for example, thermal oxidation. A silicon nitride layer 210 is then formed on the oxide layer 208. The silicon nitride layer 210, about 120 angstroms to about 180 angstroms thick, is formed by, for example, chemical vapor deposition. Thereafter, the silicon nitride layer 210 and the oxide layer 208 are patterned to form an opening 211, exposing a portion of the substrate 200.

Referring to FIG. 2B, a thermal oxidation process is conducted to form concurrently an oxide layer 212 on the silicon nitride layer 210 and a field oxide layer 206 on the exposed substrate 200. The thermal oxidation process includes a wet oxidation process, wherein the wet oxidation process is conducted at a temperature of about 850 degrees Celsius to about 1050 degrees Celsius, an oxygen flow rate of about 5 L/min to about 30 L/min, a hydrogen flow rate of about 2 L/min to about 20 L/min and a nitrogen flow rate of about 0 L/min to about 30 L/min for about 80 to 120 minutes. The oxide layer 212 and the field oxide layer 206 are formed at a rate ratio of about 1:35 to 1:45. The oxide layer 212 is about 75 angstroms to 105 angstroms thick and the silicon nitride layer 210, subsequent to the above patterning process is about 35 angstroms to about 65 angstroms thick. The fabrication of an oxide layer-nitride layer-oxide layer for a flash memory device is thus completed.

Since an oxide layer of about 100 angstroms thick is formed on a silicon nitride layer, which is equivalent of growing an oxide layer of about 3500 angstroms to about 4500 angstroms thick on a substrate. Performing an oxidation process to form an oxide layer on the silicon nitride layer and on the silicon substrate, respectively at a rate ratio of about 1:35 to 1:45, the oxide layers with the desired thickness are thus formed on the silicon nitride layer and the silicon substrate, respectively. As a result, forming an oxide layer 212 on a silicon nitride layer 210, a field oxide layer 206 is concurrently formed on the substrate 200 exposed by the opening 211. The manufacturing process for an oxide layer-nitride layer-oxide layer of a flash memory device is greatly simplified to reduce the manufacturing cost.

Continuing to FIG. 2C, the oxide layer 212, the silicon nitride layer 210 and the oxide layer 208 are patterned to form a tunnel oxide layer 208a, a silicon nitride gate layer 210a and an oxide dielectric layer 212a. After this, ions are implanted between the ONO structures to form the buried bit line in the substrate 200. A polysilicon type of control gate layer is formed on the silicon oxide dielectric layer 212a to complete the fabrication of a flash memory device.

According to the present invention, the formation of the oxide dielectric layer and the field oxide layer are combined to greatly reduce the number of processing steps and to simplify the manufacturing procedure.

According to the present invention, the formation of the oxide dielectric layer and the field oxide layer are combined to greatly reduce the manufacturing cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a silicon nitride floating gate for a read-only memory, comprising:

providing a substrate;

forming a first oxide layer on the substrate;

forming a silicon nitride layer on the first oxide layer;

patterning the silicon nitride layer and the first oxide layer to form an opening, exposing a portion of the substrate;

forming concurrently a second oxide layer on the silicon nitride layer and a field oxide layer on the substrate exposed by the opening; and patterning the second oxide layer, the silicon nitride layer and the first oxide layer to form an oxide dielectric layer, a silicon nitride floating gate layer and a tunnel oxide layer.

2. The method of claim 1, wherein the second oxide layer and the field oxide layer are formed at a rate ratio of about 1:35 to about 1:45.

3. The method of claim 1, wherein forming concurrently the second oxide layer on the silicon nitride layer and the field oxide layer on the substrate exposed by the opening include performing an oxidation process.

4. The method of claim 3, wherein the oxidation process includes wet oxidation.

5. The method of claim 4, wherein wet oxidation is conducted at an oxygen flow rate of about 5 L/min to about 30 L/min, a hydrogen flow rate of about 2 L/min to about 20 L/min and a nitrogen flow rate of about 0 L/min to about 30 L/min.

6. The method of claim 4, wet oxidation is conducted at a temperature of about 850 degrees Celsius to about 1050 degrees Celsius.

7. The method of claim 4, wherein wet oxidation is conducted for about 80 to 120 minutes.

8. The method of claim 1, wherein the second oxide layer is about 75 angstroms to about 105 angstroms thick.

9. The method of claim 1, wherein the silicon nitride layer is about 120 angstroms to about 180 angstroms thick.

10. The method of claim 1, wherein the first oxide layer is about 50 angstroms to about 100 angstroms thick.

11. A method for fabricating a read-only memory, comprising:

providing a substrate;

forming a first oxide layer and a material layer on the substrate, wherein a portion of the substrate is not covered by the first oxide layer and the material layer; and forming concurrently a second oxide layer on the material layer and a third oxide layer on the exposed substrate, wherein the second oxide layer on a top surface of the material layer and the material layer are retained as a gate dielectric.

12. The method of claim 11, wherein the material layer includes silicon nitride layer.

13. The method of claim 11, wherein the second oxide layer and the third oxide layer are formed at a rate ratio of about 1:35 to about 1:45.

14. The method of claim 11, wherein forming concurrently a second oxide layer on the material layer and a third oxide layer on the exposed substrate includes performing an oxidation process.

15. The method of claim 14, wherein performing the oxidation process includes performing a wet oxidation process.

16. The method of claim 15, wherein the wet oxidation process is conducted at an oxygen flow rate of about 5 L/min to about 30 L/min, a hydrogen flow rate of about 2 L/min to about 20 L/min and a nitrogen flow rate of about 0 L/min to about 30 L/min.

17. The method of claim 15, wherein the wet oxidation process is conducted at a temperature of about 850 degrees Celsius to about 1050 degree Celsius.

18. The method of claim 15, wherein the wet oxidation is conducted for about 80 minutes to about 120 minutes.

19. The method of claim 11, wherein the second oxide layer is about 75 angstroms to about 105 angstroms thick.

20. The method of claim 11, wherein the material layer is about 120 angstroms to about 180 angstroms thick.

21. The method of claim 11, wherein the first oxide layer is about 50 angstroms to about 100 angstroms thick.

* * * * *